US008878598B2

(12) United States Patent
Tai

(10) Patent No.: US 8,878,598 B2
(45) Date of Patent: Nov. 4, 2014

(54) SENSING MODULE

(71) Applicant: British Virgin Islands Central Digital Inc., Road Town (VG)

(72) Inventor: Chun-Yu Tai, New Taipei (TW)

(73) Assignee: British Virgin Islands Central Digital Inc., Tortola (VG)

( * ) Notice: Subject to any disclaimer, the term of this patent is extended or adjusted under 35 U.S.C. 154(b) by 0 days.

(21) Appl. No.: 13/891,770

(22) Filed: May 10, 2013

(65) Prior Publication Data

US 2013/0239695 A1 Sep. 19, 2013

Related U.S. Application Data

(63) Continuation-in-part of application No. 13/335,258, filed on Dec. 22, 2011, now abandoned.

(30) Foreign Application Priority Data

Dec. 28, 2010 (TW) ............................ 099146238 A

(51) Int. Cl.
*H01L 35/00* (2006.01)
*G05F 1/46* (2006.01)
*G05F 3/30* (2006.01)

(52) U.S. Cl.
CPC . *G05F 1/463* (2013.01); *G05F 3/30* (2013.01)
USPC ............................................ 327/513; 702/98

(58) Field of Classification Search
CPC ............... G01L 9/02; G01L 9/04; G01L 9/06; G01L 9/025; G01L 9/045; G01L 9/065; G01L 9/2281
USPC ............................... 327/513; 702/94, 104, 98
See application file for complete search history.

(56) References Cited

U.S. PATENT DOCUMENTS

| | | | | |
|---|---|---|---|---|
| 4,057,755 | A | 11/1977 | Piesche | |
| 4,174,639 | A * | 11/1979 | Raven | 73/766 |
| 4,190,796 | A * | 2/1980 | Ishii | 323/280 |
| 4,202,666 | A | 5/1980 | Hall et al. | |
| 4,229,692 | A | 10/1980 | Graeme | |
| 4,233,848 | A * | 11/1980 | Sato et al. | 73/727 |
| 4,298,834 | A | 11/1981 | Opfer | |
| 4,337,665 | A | 7/1982 | Sato et al. | |
| 4,361,802 | A | 11/1982 | Luijpers | |
| 4,362,060 | A | 12/1982 | Okayama et al. | |
| 4,414,853 | A | 11/1983 | Bryzek | |
| 4,419,620 | A | 12/1983 | Kurtz et al. | |
| 4,461,166 | A | 7/1984 | Gatten et al. | |
| 4,533,520 | A | 8/1985 | Bossart et al. | |
| 4,556,807 | A * | 12/1985 | Yamada et al. | 327/513 |

(Continued)

*Primary Examiner* — Thomas J Hiltunen
(74) *Attorney, Agent, or Firm* — Muncy, Geissler, Olds & Lowe, P.C.

(57) ABSTRACT

A sensing module of the disclosure comprises a sensing device, a voltage generating device, a compensating device, and a voltage controlling device. The sensing device comprises a first reference terminal and a second reference terminal. The compensating device is coupled between the second reference terminal and a voltage reference terminal. The voltage controlling device is respectively coupled to the first reference terminal, the second reference terminal, and the voltage generating device. The voltage controlling device is used for outputting a first voltage signal to the first reference terminal based on the reference voltage signal and a cross voltage of the compensating device. A temperature variation of an impedance of the compensating device positively correlates to a temperature variation of an impedance of the sensing device. A temperature variation of a sensitivity of the sensing device negatively correlates to a temperature variation of the reference voltage signal.

10 Claims, 5 Drawing Sheets

(56) References Cited

U.S. PATENT DOCUMENTS

| | | | | | |
|---|---|---|---|---|---|
| 4,633,219 | A | | 12/1986 | Zojer et al. | |
| 4,813,272 | A | | 3/1989 | Miyazaki et al. | |
| 4,911,016 | A | | 3/1990 | Miyazaki et al. | |
| 5,043,610 | A | * | 8/1991 | Craddock | 327/307 |
| 5,053,692 | A | | 10/1991 | Craddock | |
| 5,055,269 | A | | 10/1991 | Palumbo et al. | |
| 5,081,869 | A | | 1/1992 | Hackey et al. | |
| 5,189,362 | A | * | 2/1993 | Doble | 324/106 |
| 5,345,184 | A | * | 9/1994 | Andoh | 324/720 |
| 5,410,908 | A | * | 5/1995 | Erichsen | 73/31.05 |
| 5,475,623 | A | * | 12/1995 | Stocker | 702/98 |
| 5,557,972 | A | * | 9/1996 | Jacobs et al. | 73/756 |
| 5,610,604 | A | | 3/1997 | Leacock et al. | |
| 5,668,320 | A | | 9/1997 | Cowan | |
| 5,684,428 | A | * | 11/1997 | Nomura et al. | 327/509 |
| 5,686,826 | A | | 11/1997 | Kurtz et al. | |
| 5,764,067 | A | * | 6/1998 | Rastegar | 324/725 |
| 5,965,807 | A | * | 10/1999 | Yamashita et al. | 73/129 |
| 6,107,861 | A | | 8/2000 | Mayer | |
| 6,222,470 | B1 | * | 4/2001 | Schuelke | 341/119 |
| 6,433,725 | B1 | | 8/2002 | Chen et al. | |
| 6,877,379 | B2 | | 4/2005 | Kurtz et al. | |
| 7,003,418 | B2 | * | 2/2006 | Bonne et al. | 702/100 |
| 7,331,237 | B2 | * | 2/2008 | Borenstein | 73/708 |
| 7,577,539 | B2 | * | 8/2009 | Hubanks et al. | 702/104 |
| 2009/0255736 | A1 | | 10/2009 | Naito et al. | |
| 2010/0125426 | A1 | | 5/2010 | Kurtz et al. | |

* cited by examiner

SENSING MODULE

CROSS-REFERENCE TO RELATED APPLICATIONS

This non-provisional application is a continuation-in-part patent application of U.S. application Ser. No. 13/335,258 filed on Dec. 22, 2011, which claims priority under 35 U.S.C. §119(a) on Patent Application No(s). 099146238 filed in Taiwan, R.O.C. on Dec. 28, 2010, the entire contents of which are hereby incorporated by reference.

BACKGROUND

1. Field

The present disclosure relates to a circuit and a method for temperature compensation of a sensor, and more particularly to a circuit and a method for temperature compensation of a sensor which perform compensation for output variation generated due to change of an environment temperature.

2. Related Art

With the advance of science and technology, more and more sensors are designed and developed. There are various sensors, such as pressure sensors, temperature sensors, gas sensors, sound sensors, brightness sensors, speed sensors, and image sensors. Sensors are also widely used in various fields, such as, medical apparatus, public transportation vehicle, safety detection, entertainment, national defense, and so on.

In the field of pressure sensing, strain gauge, also called strain gage, is broadly used. Linearity is one most important issue of the pressure sensor. Ideally, the output voltage of a Wheatstone bridge with a strain gauge is directly proportional to the pressure received by the strain gauge but independent from temperature. However, it is found that the output voltage of the aforementioned Wheatstone bridge is also a function of temperature.

Furthermore, another important issue of the pressure sensor is the sensitivity. It is required that the pressure sensor may perform at 80° C. as well as at 25° C. However, because of the material characteristic of the pressure sensor, the sensitivity of the pressure sensor varies with temperature.

In such circumstances, a measured result at 25° C. is different from a measured result in 100° C. Such difference may introduce some sensing problems and is an error to be compensated.

In a current system using a sensor, in order to improve preciseness, temperature compensation measures are generally implemented for the sensor for avoiding the problems caused from the variation of the environment temperature. The measures include two types: (1) by use of a hardware line to perform temperature compensation, and (2) by use of a hardware line in cooperation with software temperature compensation. The two types are respectively described as follows:

(1) By use of a hardware line to perform temperature compensation:

In the amplifier circuit connecting behind the sensor output terminal, elements having temperature features such as a thermistor or temperature sensor are added to the loop of the amplifier circuit to automatically adjust the gain factor.

(2) By use of a hardware line in cooperation with the software temperature:

Elements having temperature features such as a thermistor or temperature sensor are added to the system to sense the environment temperature, and then the processor circuit compensates the temperature offset.

However, the two temperature compensation manners for the conventional sensor both have disadvantages. First, the circuit structure of the former one is complex and requires correction; and although the circuit structure of the latter one is simple, the offset needs to be corrected for each temperature point, which is very time-consuming.

For these reasons, it is desirous to provide a circuit and a method for temperature compensation of a sensor performing compensation for the output variation generated due to the change of the environmental temperature so as to avoid deficiency of the temperature compensation manners for the conventional sensor.

SUMMARY

In order to solve the aforementioned problem, a sensing module is disclosed to compensate the temperature dependency of the sensitivity of the sensor and the temperature dependency of the transfer function of the sensor so that the output signal of the sensor is no longer influenced by environmental temperature.

In one or more exemplary embodiments, a sensing module in accordance with this disclosure comprises a sensing device, a voltage generating device, a compensating device, and a voltage controlling device. The sensing device comprises a first reference terminal and a second reference terminal. The sensing device is used for generating a sensing signal based on received pressure, wherein there is equivalent impedance between the first reference terminal and the second reference terminal. The voltage generating device is used for generating a reference voltage signal. The compensating device is coupled between the second reference terminal and a voltage reference terminal. The voltage controlling device is respectively coupled to the first reference terminal, the second reference terminal, and the voltage generating device. The voltage controlling device is used for outputting a first voltage signal to the first reference terminal based on the reference voltage signal and a cross voltage of the compensating device. In the sensing module, a sensitivity of the sensing device is a first function of temperature, the equivalent impedance is a second function of temperature, an impedance of the compensating device is a third function of temperature, and a value the reference voltage is a fourth function of temperature. The first function of temperature negatively correlates to the fourth function of temperature. The second function of temperature positively correlates to the third function of temperature.

The sensing module in accordance with this disclosure provides a sensing signal with lower temperature sensitivity and higher power supply rejection ratio (PSRR). The sensing module in accordance with this disclosure, therefore, reduces the complexity of design of a backend device in the field of the sensing application.

In order to make the aforementioned and other features and advantages of the present disclosure more comprehensible, several embodiments accompanied with figures are described in detail below.

BRIEF DESCRIPTION OF THE DRAWINGS

The present disclosure will become more fully understood from the detailed description given herein below for illustration only, and thus are not limitative of the present disclosure, and wherein.

DETAILED DESCRIPTION

Reference will now be made in detail to exemplary embodiments which are illustrated in the accompanying drawings. Hereinafter, the embodiments are described with Figures. It should be appreciated that the embodiments described herein are used for describing and explaining the present disclosure but not for limiting the disclosure.

Figure 1:
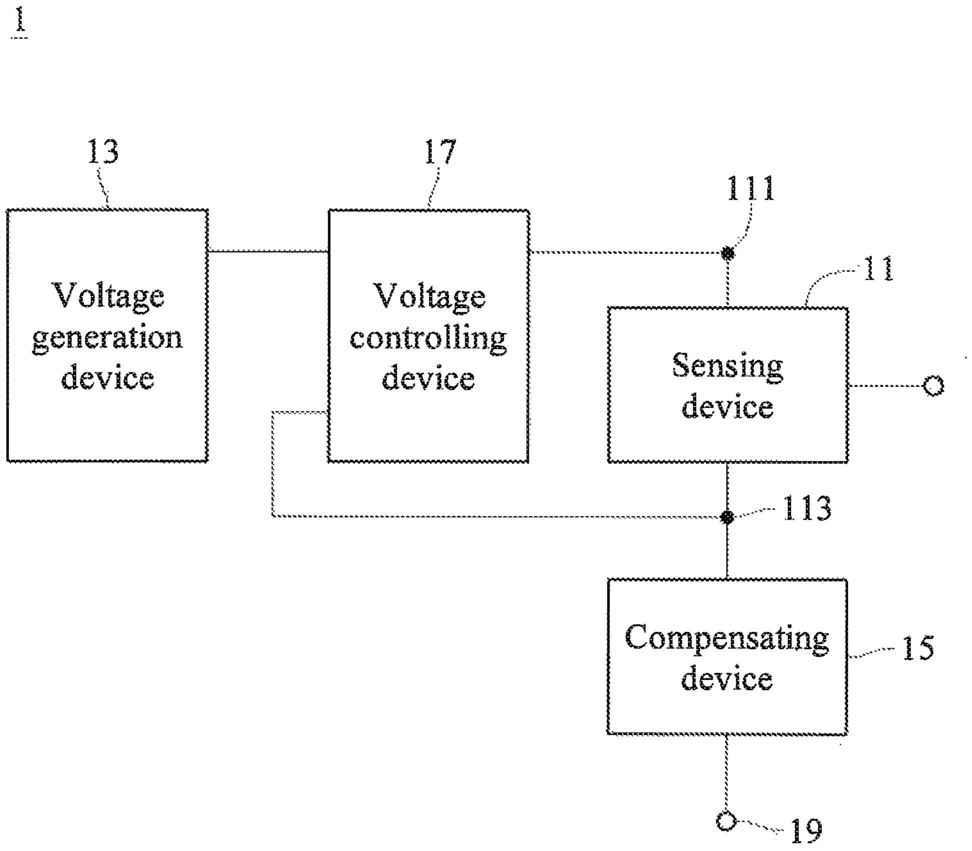
FIG. 1 illustrates a functional block diagram of a sensing module in accordance with this disclosure.

Please refer to FIG. 1, which illustrates a functional block diagram of a sensing module in accordance with this disclosure. As shown in FIG. 1, a sensing module 1 comprises a sensing device 11, a voltage generating device 13, a compensating device 15, and a voltage controlling device 17. The sensing device 11 comprises a first reference terminal 111 and a second reference terminal 113. The compensating device 15 is coupled between the second reference terminal 113 and a voltage reference terminal 19. The voltage controlling device 17 is respectively coupled to the first reference terminal 111, the second reference terminal 113, and the voltage generating device 13.

Sensing Device

Figure 2A:
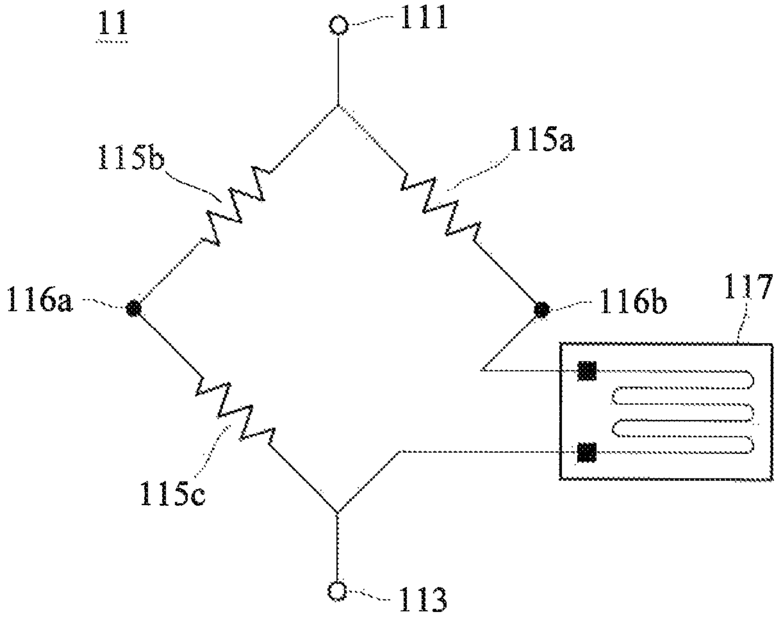
FIG. 2A illustrates a schematic circuit diagram of a sensing device in accordance with this disclosure.

The sensing device 11 is used for generating a sensing signal based on received pressure. In one embodiment, please refer to FIG. 2A, which illustrates a schematic circuit diagram of a sensing device in accordance with this disclosure. As shown in FIG. 2A, the sensing device 11 comprises the first reference terminal 111, the second reference terminal 113, a first resistor 115*a*, a second resistor 115*b*, a third resistor 115*c*, and a strain gauge 117. The first resistor 115*a*, the second resistor 115*b*, and the third resistor 115*c* are all pressure insensitive resistors. While the sensing device 11 receives no pressure, the resistance of each of the resistors 115*a* to 115*c* and the resistance of the strain gauge 117 are equal. While the sensing device 11 receives pressure, a resistance of the strain gauge 117 is changed by the received pressure. If a voltage difference is applied to the first reference terminal 111 and the second reference terminal 113, a voltage value at the node 116*a* is different from a voltage value at the node 116*b* only when the sensing device 11 receives pressure.

A voltage difference $V_o$ between the node 116*a* and the node 116*b* is a sensing signal. Assuming that the resistance of each of the resistors 115*a* to 115*c* is R, the received pressure is ΔP, the resistance of the strain gauge 117 is equal to (R+kΔP), and a voltage difference $V_{in}$ is applied to the first reference terminal 111 and the second reference terminal 113. The voltage difference $V_o$ between the node 116*a* and the node 116*b* may be found as below.

$$V_o = k\Delta P V_{in}/(4R+2k\Delta P) \quad (1)$$

The first expression may be simplified as below if the received pressure is negligible.

$$V_o = k\Delta P V_{in}/4R \quad (2)$$

Hence, the voltage difference $V_o$ is a linear transformation of the received pressure Δ P.

Figure 2B:
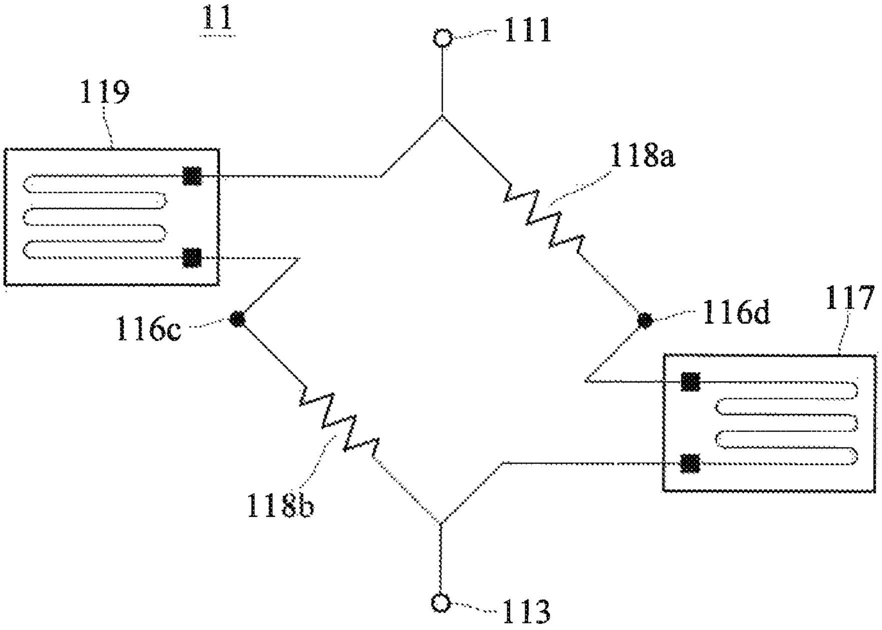
FIG. 2B illustrates another schematic circuit diagram of a sensing device in accordance with this disclosure.

In another embodiment, please refer to FIG. 2B, which illustrates another schematic circuit diagram of a sensing device in accordance with this disclosure. As shown in FIG. 2B, the sensing device 11 comprises the first reference terminal 111, the second reference terminal 113, a first resistor 118*a*, a second resistor 118*b*, a first strain gauge 119*a*, and a second strain gauge 119*b*. The first resistor 118*a* and the second resistor 118*b* are both pressure insensitive resistors. While the sensing device 11 receives no pressure, the resistance of each of the resistor 118*a*, the resistor 118*b*, the strain gauge 119*a*, and the strain gauge 119*b* are the same. While the sensing device 11 receives pressure, the resistance of each of the strain gauges 119*a* and 119*b* is changed by the received pressure. If a voltage difference is applied to the first reference terminal 111 and the second reference terminal 113, a voltage value at the node 116*c* is different from a voltage value at the node 116*d* only when the sensing device 11 receives pressure.

The voltage difference $V_o$ between the node 116*c* and the node 116*d* is a sensing signal. Assuming that the resistance of each of the resistors 118*a* and 118*b* is R, the received pressure is ΔP, the resistance of each of the strain gauges 119*a* and 119*b* is equal to (R+k ΔP), and a voltage difference $V_{in}$ is applied to the first reference terminal 111 and the second reference terminal 113. The voltage difference $V_o$ between the node 116*c* and the node 116*d* may be found as below.

$$V_o = k\Delta P V_{in}/(2R+k\Delta P) \quad (3)$$

The third expression may be simplified as below if the received pressure is negligible.

$$V_o = k\Delta P V_{in}/2R \quad (4)$$

Hence, the voltage difference $V_o$ is a linear transformation of the received pressure Δ P.

Although only two types of Wheatstone bridge are disclosed, it is not to limit the scope of this disclosure. Other devices having a Wheatstone bridge therein may be used in accordance with this disclosure.

Although the transformation from the received pressure ΔP to the voltage difference $V_o$ of the aforementioned sensing device 11 is substantially a linear transformation, the sensing device 11 suffers from other nonlinearity issues such as the variation of the sensitivity and the variation of the equivalent impedance.

Figure 3:
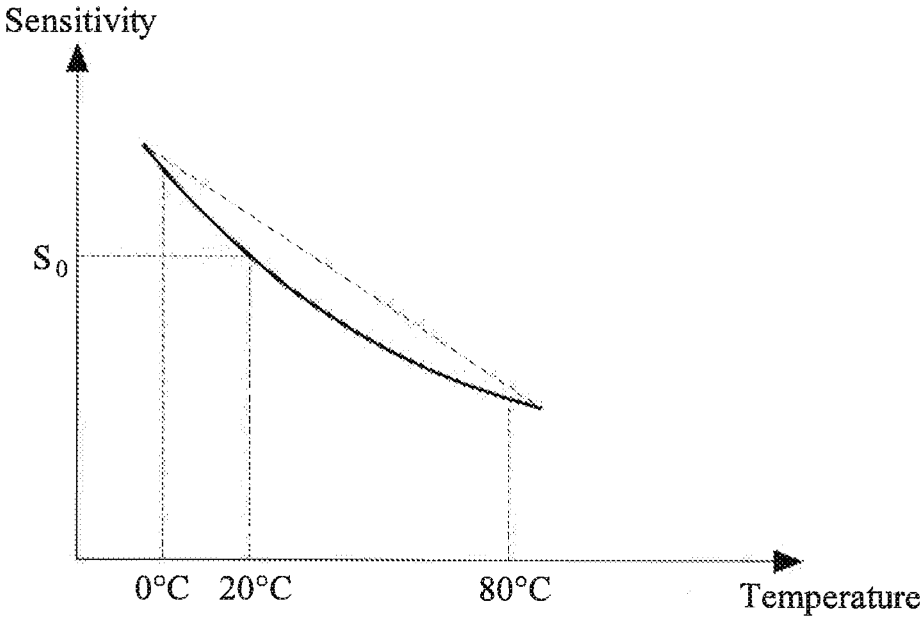
FIG. 3 illustrates a variation of the sensitivity of the sensing device.

Please refer to FIG. 3, which illustrates a variation of the sensitivity of the sensing device. While a fixed voltage difference is applied to the first reference terminal 111 and the reference terminal 113, it is desired that the sensitivity of the sensing device 11 is constant. However, as shown in FIG. 3, the sensitivity of the sensing device 11 decreases as temperature rises. Also, it may be found that the sensitivity of the sensing device 11 is a first function of temperature. The first function of temperature may be seen as a second-order polynomial of temperature with a positive second-order coefficient. To compensate the variation of the sensitivity of the sensing device 11, an applied voltage of which the value is negative correlating to the first function is desired, and the voltage generating device 13 is used.

The variation of the equivalent impedance of the sensing device 11 is result from the variation of resistance of the resistors and the strain gauge(s) within the sensing device 11. The value of the equivalent impedance of the sensing device 11 may be measured between the first reference terminal 111 and the second reference terminal 113, and is a second function of temperature as below.

$$R_{sensing}(T)=R_0[1+\alpha(T-T_0)] \quad (5)$$

In the fifth expression, T is temperature, $\alpha$ is the temperature coefficient of resistance (TCR) of the sensing device 11, $T_0$ is the reference temperature, and $R_0$ is the value of the equivalent impedance of the sensing device 11 at the reference temperature $T_0$.

Returning to FIG. 2B, because the TCR of each of the strain gauges 117 and 119 is different from the TCR of each of the resistors 118*a* and 118*b*, another error, called zero offset, is introduced. The zero offset is an output offset voltage of the sensing device 11 when zero pressure is received by the sensing device 11. To compensate the zero offset and to ensure that the applied voltage difference $V_{in}$ of the sensing device 11 is controllable, the compensating device 15 is used.

Voltage Generating Device

The voltage generating device 13 is used for generating a reference voltage signal. Specifically, the voltage generating device 13 is used for compensating the variation of the sensitivity of the sensing device 11.

Figure 4A:
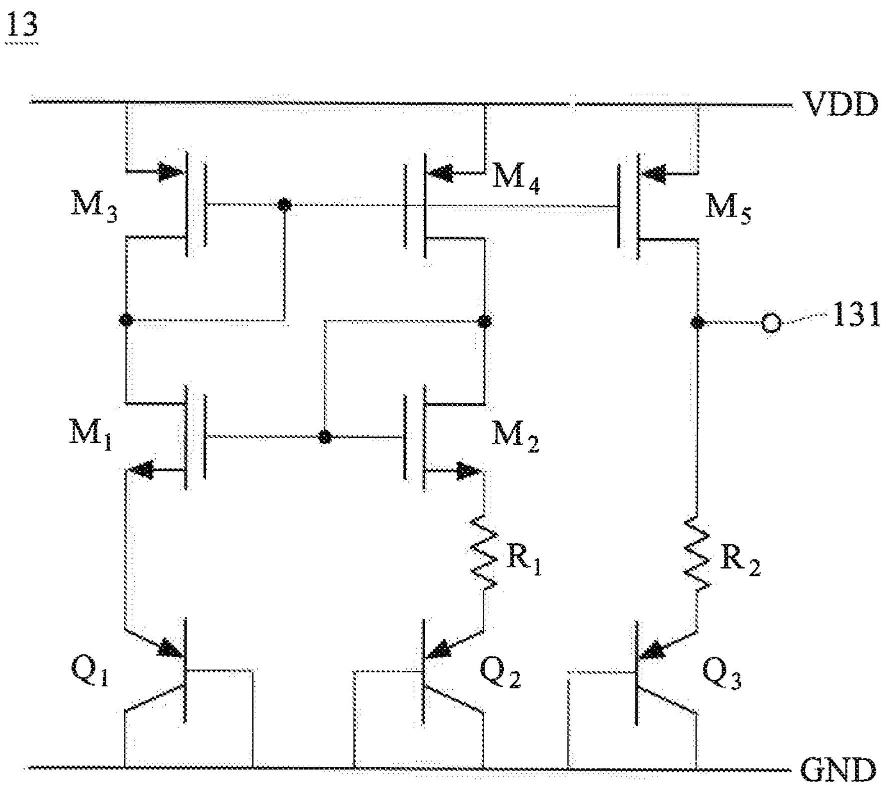
FIG. 4A illustrates a schematic circuit diagram of a voltage generating device in accordance with this disclosure.

In one embodiment, please refer to FIG. 4A, which illustrates a schematic circuit diagram of a voltage generating device in accordance with this disclosure. As shown in FIG. 4A, the voltage generating device 13 comprises a first metal oxide semiconductor field effect transistor (MOSFET, MOS) $M_1$, a second MOSFET $M_2$, a third MOSFET $M_3$, a fourth MOSFET $M_4$, a fifth MOSFET $M_5$, a first bipolar junction transistor (BJT) $Q_1$, a second BJT $Q_2$, a third BJT $Q_3$, a first resistor $R_1$, and a second resistor $R_2$. It is known that the voltage generating device 13 disclosed in FIG. 4A is a bandgap reference circuit, capable of providing the reference voltage signal $V_{ref}$ at the output terminal 131. Usually, the bandgap reference circuit is used for providing a temperature-invariant reference voltage. However, in the present invention, with certain choice of transistors and/or resistors of the bandgap reference circuit, the reference voltage signal $V_{ref}$ varies with temperature. Specifically, the reference voltage signal $V_{ref}$ is a voltage proportional to absolute temperature (PTAT). Furthermore, the voltage value of the reference voltage signal $V_{ref}$ is a fourth function of temperature. The fourth function of temperature is substantially a second-order polynomial with a negative second-order coefficient, and is negatively correlating to, or more precisely, inversely proportional to the first function of temperature within a particular range of temperature, such as 20° C. to 60° C., −15° C. to 20° C., or −15° C. to 60° C.

Figure 4B:
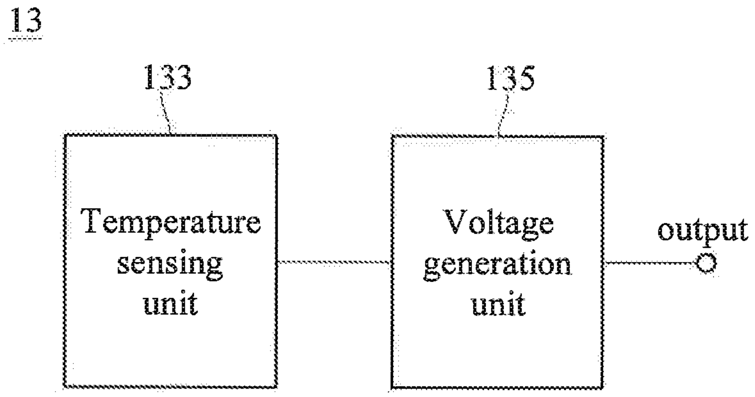
FIG. 4B illustrates a functional block diagram of a voltage generating device in accordance with this disclosure.

In another embodiment, please refer to FIG. 4B, which illustrates a functional block diagram of a voltage generating device in accordance with this disclosure. As shown in FIG. 4B, the voltage generating device 13 comprises a temperature sensing unit 133 and a voltage generating unit 135 coupled to the temperature sensing unit 133.

The temperature sensing unit 133 is used for generating a temperature signal based on environmental temperature. In practice, a thermistor may be used as the temperature sensing unit because the value of the resistance of the thermistor varies with temperature. The temperature sensing unit 133 is, for example but not limited to, a thermistor, an frequency-based thermometer, an analog-to-digital-converter-based thermometer, or any other devices applicable for sensing temperature.

The voltage generating unit 135 is used for generating the reference voltage signal $V_{ref}$ based on the temperature signal. In practice, because the voltage value of the reference voltage signal $V_{ref}$ shall be a second-order polynomial based on temperature with a negative second-order coefficient, the voltage generating unit 135 may comprise a processor for calculating the voltage value of the reference voltage signal $V_{ref}$ based on the temperature signal and a built-in second-order polynomial.

In the aforementioned embodiment of the voltage generating device 13, the reference voltage signal $V_{ref}$ is isolated from the power supply. Hence, the reference voltage signal $V_{ref}$ is barely influenced by the noise from the power supply and achieves a high power supply rejection ratio (PSRR).

Although only two types of the voltage generating device 13 are disclosed, it is not to limit the scope of this disclosure. Any other devices capable of generating a PTAT reference voltage with a negative second-order coefficient and high PSRR may be used in accordance with this disclosure.

Compensating Device

The compensating device 15 is used for compensating a temperature variation of the sensing device 11. Specifically, the compensating device 15 is used for compensating the variation of the impedance of the sensing device 11. In one embodiment, the compensating device 15 may be a compensating resistor with certain temperature coefficient of resistance (TCR). Specifically, the TCR of the aforementioned compensating resistor is closed to the TCR of the sensing device 11 so that the value of the resistance of the compensating device 15 is a third function of temperature which positively correlates to the equivalent impedance of the sensing device 11, which is the second function of temperature, within a particular range of temperature, such as 20° C. to 60° C., −15° C. to 20° C., or −15° C. to 60° C.

In another embodiment, the TCR of the aforementioned compensating resistor is slightly higher than the TCR of the sensing device 11 at high temperature and/or low temperature. Specifically, the TCR of the compensating resistor is substantially a second-order polynomial with a positive second-order coefficient. Hence, the cross voltage of the sensing device 11 at high temperature and the cross voltage of the sensing device 11 at low temperature are slightly lower than the cross voltage of the sensing device 11 at room temperature. Therefore, the zero offset due to the difference between the resistance of each of the resistor 118*a* and 118*b* and the resistance of the strain gauges 117 and 119 is reduced.

Figure 5:
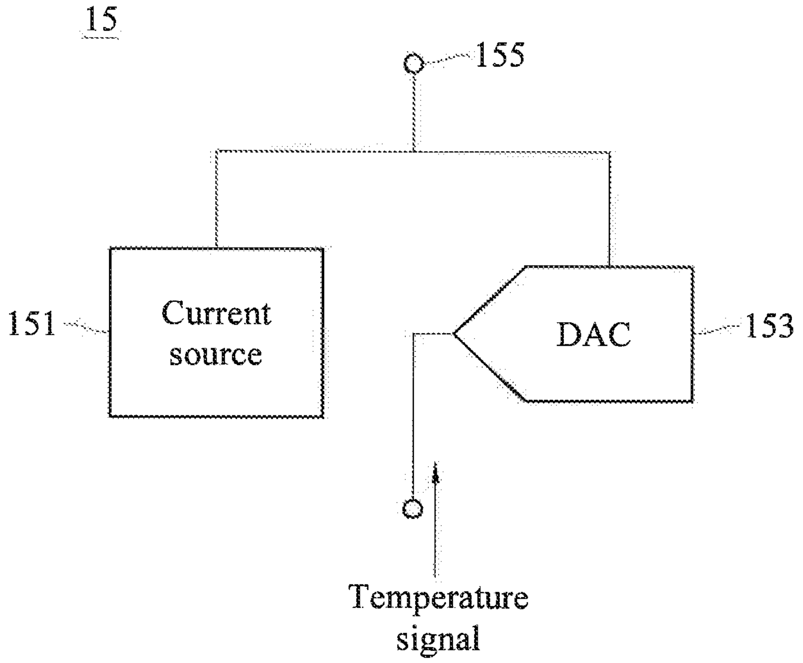
FIG. 5 illustrates a functional block diagram of a compensating device in accordance with this disclosure

In another embodiment, the compensating device 15 may be a digital-to-analog converter (DAC). Please refer to FIG. 5, which illustrates a functional block diagram of a compensating device in accordance with this disclosure. As shown in FIG. 5, the compensating device 15 comprises a current source 151 and a digital-to-analog converter 153. The current source 151 is used for generating a temperature independent current $I_1$. The digital-to-analog converter 153 receives the temperature signal from the voltage generating device 13 and generates a temperature dependent current based on the temperature signal. The temperature independent current and the temperature dependent current are output at the output terminal 155. Hence, an output resistance measured at the output terminal 155 is inversely proportional to a sum of the temperature independent current and the temperature dependent current.

Specifically, in order to compensate the variation of resistance of the sensing device 11, the value of the output resistance measured at the output terminal 155 of the compensating device 15, which is equivalently the third function of temperature, shall be positively correlating to, or more precisely, substantially directly proportional to the equivalent impedance of the sensing device 11.

Although only two types of the compensating device 15 are disclosed, it is not to limit the scope of this disclosure. Any other devices capable of generating a PTAT impedance of which the TCR is closed to the TCR of the equivalent impedance of the sensing device 11 may be used in accordance with this disclosure.

Voltage Controlling Device

The voltage controlling device 17 is used for outputting a first voltage signal to the first reference terminal 111 based on the reference voltage signal and the cross voltage of the compensating device 15. In one embodiment, the voltage controlling device 17 may be an operational amplifier with a first input terminal, a second terminal, and an output terminal. The output terminal of the operational amplifier is connected to the first reference terminal 111. The first input terminal is connected to the voltage generating device for receiving the reference voltage signal. The second input terminal is connected to the second reference terminal 113 for receiving the cross voltage of the compensating device 15. Hence, the operational amplifier outputs a first voltage signal to the first reference terminal 111 so that the cross voltage of the compensating device 15 equals to the reference voltage signal.

In another embodiment, the voltage controlling device 17 may comprises a processing unit and a digital-to-analog converter (DAC). The processing unit receives the cross voltage of the compensating device 15 and the reference voltage signal $V_{ref}$ and calculates a difference between the value of the first voltage signal and the desired value. The processor also controls the DAC to adjust the first voltage signal so that the value of the first voltage signal is equal to the desired value.

Although only two types of the voltage controlling device 17 are disclosed, it is not to limit the scope of this disclosure. Any other devices capable of generating the first voltage signal based on the cross voltage of the compensating device 15 and the reference voltage signal may be used in accordance with this disclosure.

Sensing Module

Because the TCR of the output impedance of the compensating device 15 is equal to the TCR of the equivalent impedance of the sensing device 11, the cross voltage of the compensating device 15 is positively correlating to, or, more precisely, directly proportional to a cross voltage of the sensing device 11. By adjusting the first voltage signal at the first reference terminal 111 so that the cross voltage of the compensating device 15 is the same as the reference voltage signal, the cross voltage of the sensing device 11 is positively correlating to, or, more precisely, directly proportional to the reference voltage signal. Hence, the variation of sensitivity and the variation of the equivalent impedance of the sensing device 11 may be reduced.

As disclosed above, the sensing module in accordance with this disclosure provides a sensing signal with lower temperature sensitivity and higher power supply rejection ratio (PSRR). The sensing module in accordance with this disclosure, therefore, reduces the complexity of design of a backend device in the field of the sensing application.

What is claimed is:

1. A sensing module, comprising:

a sensing device, comprising a first output node, a second output node, a first reference terminal and a second reference terminal, for generating a sensing signal based on received pressure, wherein there is an equivalent impedance between the first reference terminal and the second reference terminal, and the sensing signal is a voltage difference between the first output node and the second output node;

a voltage generating device, for generating a reference voltage signal;

a compensating device, coupled between the second reference terminal and a voltage reference terminal; and a voltage controlling device, respectively coupled to the first reference terminal, the second reference terminal, and the voltage generating device, for outputting a first voltage signal to the first reference terminal based on the reference voltage signal and a cross voltage of the compensating device;

wherein a sensitivity of the sensing device is a first function of temperature, the equivalent impedance is a second function of temperature, an impedance of the compensating device is a third function of temperature, a value of the reference voltage signal is a fourth function of temperature, the first function of temperature negatively correlates to the fourth function of temperature, and the second function of temperature positively correlates to the third function of temperature.

2. The sensing module in accordance with claim 1, wherein the second function of temperature substantially equals to the third function of temperature.

3. The sensing module in accordance with claim 1, wherein the first function of temperature is substantially a second-order polynomial with a positive second-order coefficient, and the fourth function of temperature is substantially a second-order polynomial with a negative second-order coefficient.

4. The sensing module in accordance with claim 1, wherein the first function of temperature is substantially a second-order polynomial with a negative second-order coefficient, and the fourth function of temperature is substantially a second-order polynomial with a positive second-order coefficient.

5. The sensing module in accordance with claim 1, wherein the voltage generating device is a bandgap reference circuit.

6. The sensing module in accordance with claim 1, wherein the voltage generating device comprising:

a temperature sensing unit, for generating a temperature signal based on environmental temperature; and a voltage generating unit, for generating the reference voltage signal based on the temperature signal.

7. The sensing module in accordance with claim 6, wherein the compensating device is coupled to the voltage generating device, and the compensating device comprises:

a current source, for providing a temperature independent current; and a digital-to-analog converter, for generating a temperature dependent current based on the temperature signal;

wherein an output current equals to a sum of the temperature independent current and the temperature dependent current, and the impedance of the compensating device equals to a ratio of an output voltage of the compensating device to the output current of the compensating device.

8. The sensing module in accordance with claim 1, wherein the compensating device is a resistor.

9. The sensing module in accordance with claim 1, wherein the third function of temperature is substantially a second-order polynomial with a positive second-order coefficient.

10. A sensing module, comprising:

a sensing device, comprising a first output node, a second output node, a first reference terminal, and a second reference terminal, for generating a sensing signal based on received pressure, wherein there is an equivalent impedance between the first reference terminal and the second reference terminal, and the sensing signal is a voltage between the first output node and the second output node;

a voltage generating device, for generating a reference voltage signal;

a compensating device, coupled between the second reference terminal and a voltage reference terminal; and a voltage controlling device, respectively coupled to the first reference terminal, the second reference terminal, and the voltage generating device, for outputting a first voltage signal to the first reference terminal based on the reference voltage signal and a cross voltage of the compensating device;

wherein a sensitivity of the sensing device is a first function of temperature, a value of the reference voltage signal is a second function of temperature, and the first function of temperature negatively correlates to the second function of temperature.

* * * * *